US012796158B2

(12) United States Patent
Isomura et al.

(10) Patent No.: US 12,796,158 B2
(45) Date of Patent: Nov. 10, 2026

(54) LIGHT RECEIVING DEVICE

(71) Applicant: Dexerials Corporation, Tochigi (JP)

(72) Inventors: Takatomo Isomura, Tochigi (JP); Etsuji Omura, Tochigi (JP)

(73) Assignee: Dexerials Corporation, Tochigi (JP)

( * ) Notice: Subject to any disclaimer, the term of this patent is extended or adjusted under 35 U.S.C. 154(b) by 393 days.

(21) Appl. No.: 18/396,636

(22) Filed: Dec. 26, 2023

(65) Prior Publication Data

US 2024/0128385 A1 Apr. 18, 2024

Related U.S. Application Data

(63) Continuation of application No. PCT/JP2021/026313, filed on Jul. 13, 2021.

(51) Int. Cl.

*G02B 3/00* (2006.01)
*G02B 19/00* (2006.01)
*H10F 77/40* (2025.01)
*H10F 77/50* (2025.01)

(52) U.S. Cl.

CPC ......... *H10F 77/407* (2025.01); *G02B 3/0037* (2013.01); *G02B 19/0009* (2013.01); *G02B 19/0076* (2013.01); *H10F 77/50* (2025.01)

(58) Field of Classification Search

CPC ............ G02B 19/0009; G02B 19/0014; G02B 3/0056; G02B 3/0068; G02B 19/0076; G02B 3/0037; H10F 77/407; G01J 3/0208

See application file for complete search history.

(56) References Cited

U.S. PATENT DOCUMENTS

| | | | | |
|---|---|---|---|---|
| 7,286,295 | B1 * | 10/2007 | Sweatt | G02B 3/0037 348/340 |
| 2006/0285214 | A1 * | 12/2006 | Haga | B29D 11/00278 359/619 |
| 2017/0010473 | A1 * | 1/2017 | Ide | G02B 3/0056 |
| 2019/0146199 | A1 * | 5/2019 | Schwalenberg | G02B 19/0028 362/11 |

FOREIGN PATENT DOCUMENTS

| | | |
|---|---|---|
| JP | 2014002062 | 1/2014 |
| JP | 2016080556 | 5/2016 |
| JP | 2016080556 A * | 5/2016 |

OTHER PUBLICATIONS

Sweatt, English translation for US-7286295-B1 (Year: 2017).*

* cited by examiner

*Primary Examiner* — Jonathan Y Jung
(74) *Attorney, Agent, or Firm* — JCIPRNET

(57) ABSTRACT

In the light receiving device 1 comprising a condensing lens, a lens holder for fixing the condensing lens, a semiconductor light receiving element, and a base for fixing the semiconductor light receiving element and the lens holder, wherein the light passing through the condensing lens enters the semiconductor light receiving element through the optical path in the lens holder. The condensing lens is a compound eye lens with a plurality of convex lens surfaces on one side, and the lens holder has a cylindrical reflective surface facing the optical path section formed in the shape of a truncated cone, the diameter of which decreases as it approaches the condensing lens. A part of light passing through the condensing lens is reflected by the reflective surface to enter the semiconductor light receiving element.

4 Claims, 6 Drawing Sheets coupling efficiency:21% coupling efficiency:20%

LIGHT RECEIVING DEVICE

CROSS-REFERENCE TO RELATED APPLICATION

This application is a continuation of the International PCT application serial no. PCT/JP2021/026313, filed on Jul. 13, 2021, which is hereby expressly incorporated by reference, in its entirety, into the present application.

TECHNICAL FIELD

The present invention relates to a light receiving device installed in a measuring instrument such as a spectroscopic analysis device, and particularly to a light receiving device that receives infrared light.

BACKGROUND ART

Conventionally, measurement instruments for spectroscopic analysis and the like have utilized light receiving devices for detecting the absorption spectrum of a specimen in, for example, an infrared light region. Such light receiving devices are required to detect weak optical signals for highly accurate analysis. Therefore, in order to increase the amount of light received by increasing the light receiving area and to improve the signal-to-noise ratio, there is a need to suppress the dark current of semiconductor photodetectors, which is one of the main causes of noise.

It is known that dark current can be reduced by reducing the area of a semiconductor light receiving element (photodiode) installed in a light receiving device. However, when the area of the semiconductor light receiving element is reduced, the area for receiving light becomes smaller, and the amount of light received decreases. Therefore, increasing the amount of received light and suppressing dark current are in a contradictory relationship, and it is not easy to achieve both.

For this reason, there is known a light receiving unit configured to condense light onto a light receiving element using a condensing lens, as disclosed in Patent Document 1, for example. The light that is incident parallel to the optical axis of the condensing lens is condensed by the condensing lens, which receives light over a wider area than the light receiving element, and then enters the light receiving element. The proportion of light that enters the area (coupling efficiency) increases.

However, in spectroscopic analysis, most of the light received by the condensing lens is diffused light scattered by the specimen. Therefore, as shown in the ray tracing simulation results of FIG. 11, for example, most of the diffused light that enters the plano-convex lens 30 as a condensing lens becomes stray light and cannot be made to enter the light receiving element 31. The coupling efficiency in this case is 21%.

On the other hand, a reflecting mirror is known that reflects diffused light incident from various directions on the inner surface of a conical cylinder, as disclosed in Patent Document 2, for example. For example, as shown in the ray tracing simulation results in FIG. 12, when a conical cylindrical reflecting mirror 32 is installed and the light is incident on the light receiving element 31, some of the light that enters the reflecting mirror 32 is incident on the light receiving element 31. In this case, the light percentage (coupling efficiency) is 20%.

PRIOR ART DOCUMENTS

Patent Documents

Patent Document #1: JP laid Open Publication No. 2014-2062.

Patent Document #2: JP Laid Open Publication No. 2016-80556.

SUMMARY OF THE INVENTION

Problems to be Solved by the Invention

In Patent Documents 1 and 2, the coupling efficiency is about 20%, and there is room for improvement in the coupling efficiency. For example, as shown in FIG. 13, we investigated a case where a plano-convex lens 30 and a reflecting mirror 32 are combined to make the light incident on the light receiving element 31, and as a result, the coupling efficiency was improved to 42%. However, the higher the coupling efficiency, the better, and further improvement of the coupling efficiency is required.

An object of the present invention is to provide a light receiving device with improved coupling efficiency when diffused light is incident.

Means to Solve the Problems

The present invention presents a light receiving device comprising a condensing lens, a lens holder on which the condensing lens is attached, a semiconductor light receiving element, and a base for fixing the semiconductor light receiving element and the lens holder, in which light transmitted through the condensing lens enters the semiconductor light receiving element through an optical path section in the lens holder; wherein the condensing lens is a compound eye lens having a plurality of convex lens surfaces on one side, the lens holder has a cylindrical reflective surface facing the optical path section formed in a truncated cone shape whose diameter decreases as it approaches the semiconductor light receiving element from the condensing lens, and a part of the light transmitted through the condensing lens is reflected by the reflective surface and enters the semiconductor light receiving element.

According to the above configuration, in the light receiving device, a part of the light transmitted through the condensing lens, which is a compound eye lens, is reflected by the reflective surface in the lens holder and travels through the truncated cone-shaped optical path section, and is received by the semiconductor light receiving element. Since the condensing lens is a compound lens, the diffused light that enters the entire condensing lens from various directions can be condensed by a plurality of convex lens surfaces. Then, the reflecting surface can reflect and condense a portion of the light that has passed through the condensing lens, and make it incident on the semiconductor light receiving element whose diameter is smaller than that of the condensing lens. Therefore, the coupling efficiency when diffused light is incident can be improved.

The present invention can apply the following various aspects.

In the first aspect, the condensing lens is a compound eye lens comprising the convex lens surface having a radius of curvature smaller than that of a partially spherical convex surface that is formed on the partially spherical convex surface formed on one side of the condensing lens.

According to the above configuration, the condensing lens is a compound eye lens having a plurality of convex lens surfaces arranged along a partially spherical convex surface. Since the optical axes of the plurality of convex lens surfaces arranged on the convex surface are tilted toward the semiconductor light receiving element, it is possible to make it easier for the light transmitted through the condensing lens to enter the semiconductor light receiving element.

In the second aspect, the condensing lens is a compound eye lens such that the farther it is from the center line of the reflective surface passing through the center of the condensing lens, the larger an intersection angle between the center line and the optical axis passing through the center of the convex lens surface.

According to the above configuration, the condensing lens is a compound eye lens having a plurality of convex lens surfaces, and the farther the convex lens surface is from the center line of the reflective surface passing through the center of the condensing lens, the more the optical axis of the convex lens surface becomes tilted relative to this center line. As a result, the optical axes of the plurality of convex lens surfaces are tilted toward the semiconductor light-receiving element, making it easier for the light transmitted through the condensing lens to enter the semiconductor light receiving element.

In the third aspect, the condensing lens is a compound eye lens in which a plurality of convex lens surfaces are integrally formed on a silicon substrate, and the semiconductor light receiving element receives infrared light.

According to the above configuration, a condensing lens can be formed by integrally forming a plurality of convex lens surfaces on a silicon substrate suitable for high precision processing, and it is possible to form a light receiving device suitable for spectroscopic analysis of infrared light transmitted through the silicon substrate can be performed.

Advantages of the Invention

According to the light receiving device of the present invention, it is possible to improve the coupling efficiency when diffused light is incident.

DESCRIPTION OF EMBODIMENTS

Hereinafter, the configuration form for implementing the present invention is demonstrated based on an Embodiment.

EMBODIMENT

Figure 1:
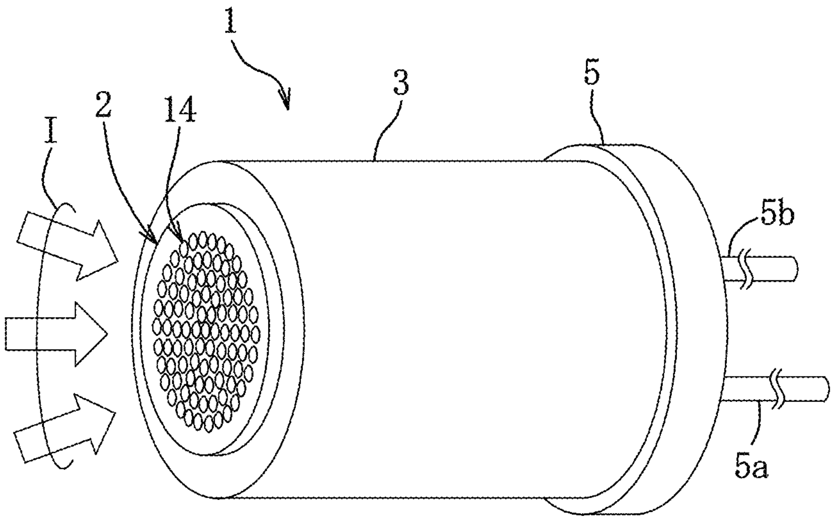
FIG. 1 is an overall view of a light receiving device according to an embodiment of the present invention.
Figure 2:
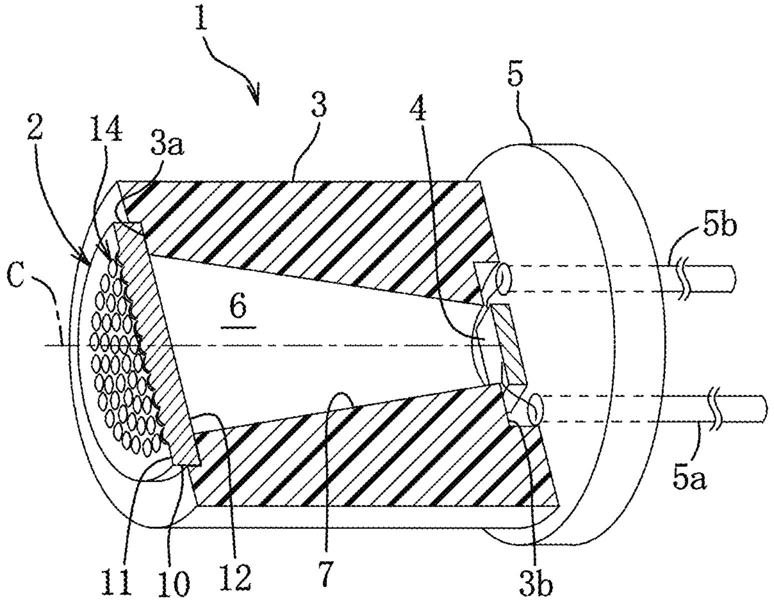
FIG. 2 is a cross sectional view of a main part of the light receiving device in FIG. 1.

As shown in FIGS. 1 and 2, the light receiving device 1 comprises a condensing lens 2, a lens holder 3 for supporting the condensing lens 2, a semiconductor light receiving element 4, and a base 5 for fixing the semiconductor light receiving element 4 and the lens holder 3. Then, as shown by arrow I, the light receiving device 1 is configured so that, for example, the diffused light scattered by the specimen enters the condensing lens 2 from various directions, and the light transmitted through the condensing lens 2 enters the semiconductor light receiving device 4.

The semiconductor light receiving element 4 is a photodiode including, for example, an indium phosphide (InP) substrate as a semiconductor substrate and an InGaAs layer as a light absorption layer. This semiconductor light receiving element 4 converts the received infrared light into photocurrent.

An anode electrode and a cathode electrode (not shown) of the semiconductor light receiving element 4 are fixed to a pair of output terminals 5*a* and 5*b* of the corresponding base 5 by, for example, metal wires. The light receiving device 1 converts the light transmitted through the condensing lens 2 and received by the semiconductor light receiving element 4 into a photocurrent, and outputs the photocurrent to the outside via a pair of output terminals 5*a* and 5*b*.

The lens holder 3 has a mounting part 3*a* for the condensing lens 2, a housing part 3*b* for the semiconductor light receiving element 4, and an optical path part 6 that communicates the mounting part 3*a* and the housing part 3*b*. This lens holder 3 is formed into a cylindrical shape with a circular or polygonal outer shape by, for example, resin molding. Further, the outer shape of the condensing lens 2 may be circular or polygonal.

The optical path section 6 is formed in the shape of a truncated cone whose diameter decreases as it approaches the semiconductor light receiving element 4 housed in the housing section 3*b* from the condensing lens 2 mounted on the mounting section 3*a*. A metal reflective film (e.g., Au film, Cr film, etc.) is formed on the surface of the lens holder 3 facing the optical path section 6 by, for example, a vapor deposition method, so that cylindrical reflecting surface 7 surrounding the side surface of the truncated conical optical path section 6 is formed. The center line C of the reflective surface 7 is common to the center line of the truncated cone shaped optical passage section 6, and the condensing lens 2 is attached to the attachment section 3*a* so that the center line C passes through the center of the condensing lens 2.

The condensing lens 2 has a plurality of partially spherical convex lens surfaces 14 integrally formed on a first surface 11 which is one side of a silicon (Si) substrate as a semiconductor substrate 10 made of the material, and. This condensing lens 2 is a compound eye lens in which the second surface 12 as the back surface of the first surface 11 is formed flat. This condensing lens 2 is mounted on the mounting section 3*a* of the lens holder 3 so that the flat second surface 12 faces the optical path section 6. The semiconductor substrate 10 forming the condensing lens 2 can transmit infrared light having a wavelength of 1.2 μm or more, for example, and has a refractive index greater than 3.2.

Figure 3:
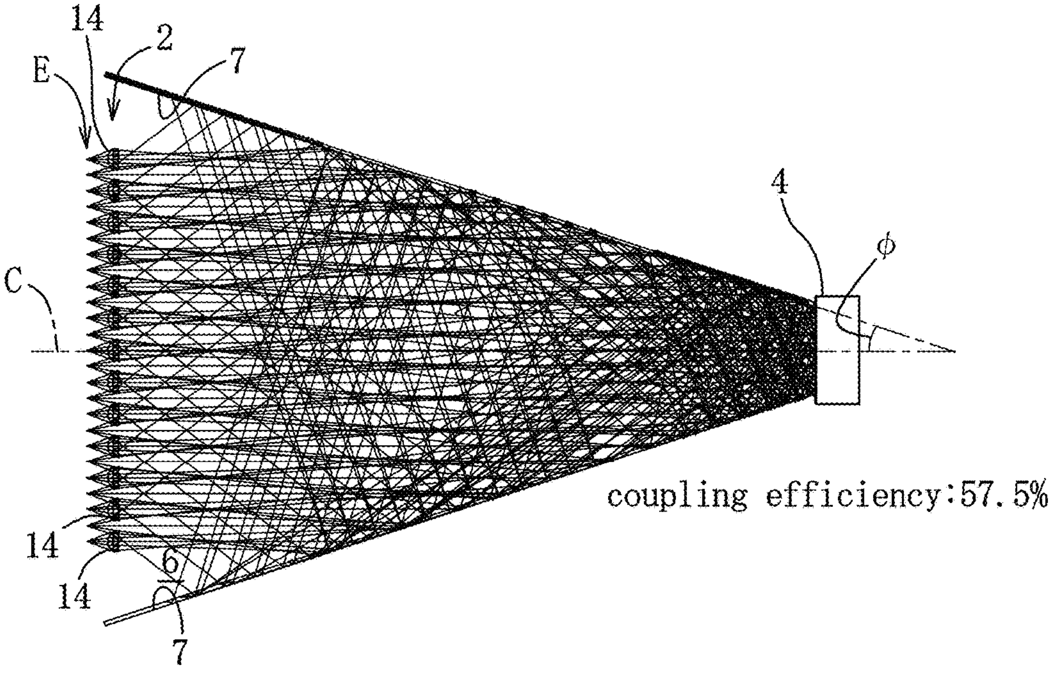
FIG. 3 is an example of ray tracing simulation results in the light receiving device according to the embodiment.

The lens holder 3 to which the condensing lens 2 is attached is positioned so that the center line C of the reflective surface 7 passes through the center of the semiconductor light receiving element 4 fixed to the base 5, and is fixed to the base 5 with adhesive, for example. FIG. 3 shows the results of a ray tracing simulation performed on the diffused light incident on this light receiving device 1.

In the ray tracing simulation, light with a divergence angle (full angle) of 40° is made to enter the condensing lens 2 from a plurality of emission points E set on the first surface 11 side of the condensing lens 2. This reproduces diffused light that enters the entire condensing lens 2 from various directions. Each convex lens surface 14 of the condensing lens 2 is set as a microlens with a diameter of 100 μm, a radius of curvature of 90 μm, and a thickness of 50 μm. A condensing lens 2 (compound lens) is reproduced by arranging a plurality of such microlenses at intervals of 50 μm.

The semiconductor light receiving element 4 has a light receiving diameter set to 500 μm. The aperture diameter of the reflective surface 7 on the semiconductor light receiving element 4 side is set to be equal to the light receiving diameter of the semiconductor light receiving element 4. Then, the reflective surface 7 is tilted by $\varphi=18°$ with respect to the center line C to increase the aperture diameter on the condensing lens 2 side, so that all of the multiple convex lens surfaces 14 of the condensing lens 2 fit inside the reflective surface 7. The distance between the microlens and the semiconductor light receiving element 4 is 2.7 mm. The center line C of the reflective surface 7 passes through the center of the condensing lens 2 and the center of the semiconductor light receiving element 4.

A portion of the light emitted from the plurality of emission points E and transmitted through the condensing lens 2 is reflected one or more times by the reflecting surface 7 and travels through the optical path section 6 toward the semiconductor light receiving element 4, Further, some light enters the semiconductor light receiving element 4 without being reflected even once on the reflecting surface 7.

Since the reflective surface 7 has a large aperture diameter on the condensing lens 2 side, when reflecting light, it increases the direction component of the light toward the condensing lens 2 side in the direction of the center line C and reduces the directional component of the light toward the light receiving element 4 (the effect of returning to the condensing lens 2 side). Therefore, although not shown in FIG. 3, some light is reflected multiple times on the reflective surface 7 and returns to the condensing lens 2 side, and does not enter the semiconductor light receiving element 4.

When the ratio of light incident on the semiconductor light receiving element 4 to the light incident on the optical path section 6 (light transmitted through the condensing lens 2) is taken as the coupling efficiency, the coupling efficiency in FIG. 3 is 57.5%. On the other hand, as a comparative example, for example, when the condensing lens 2 of the light receiving device 1 is a plano-convex lens 30 having a single convex lens surface (see FIG. 13), the coupling efficiency is 42%. In addition, the coupling efficiency is 20% when the condensing lens 2 of the light receiving device 1 is removed (see FIG. 12), and when the reflective surface 7 of the light receiving device 1 is removed and the condensing lens 2 is made into a plano-convex lens 30 (see FIG. 11) has a coupling efficiency of 21%. The condensing lens 2, which is a compound eye lens, condenses the incident diffused light, and the light traveling in the direction of the center line C through the optical path section 6 increases, so the light reflected multiple times on the reflective surface 7 and returns toward the condensing lens 2 decreases, thereby improving coupling efficiency.

Figure 4:
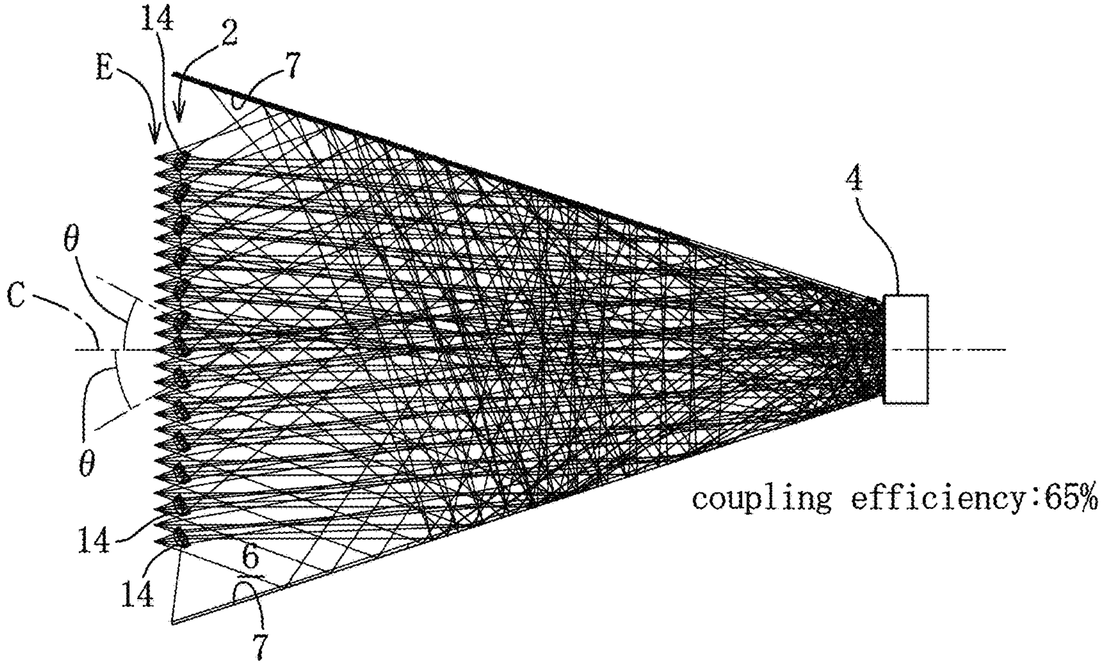
FIG. 4 is an example of ray tracing simulation results when the optical axes of the plurality of convex lens surfaces in FIG. 3 are tilted.

It is considered that the coupling efficiency is further improved if the plurality of convex lens surfaces 14 of the condensing lens 2 converge the light toward the semiconductor light receiving element 4 side (the interior side of the optical path portion 6). Therefore, the ray tracing simulation results are obtained as shown in FIG. 4 when the optical axis of the microlens in FIG. 3 is tilted so that it intersects the center line C at an intersection angle $\theta=30°$, so that the optical axis of the microlens is directed toward the semiconductor photodetector 4. is. In this case, the coupling efficiency increases to 65%.

Figure 5:
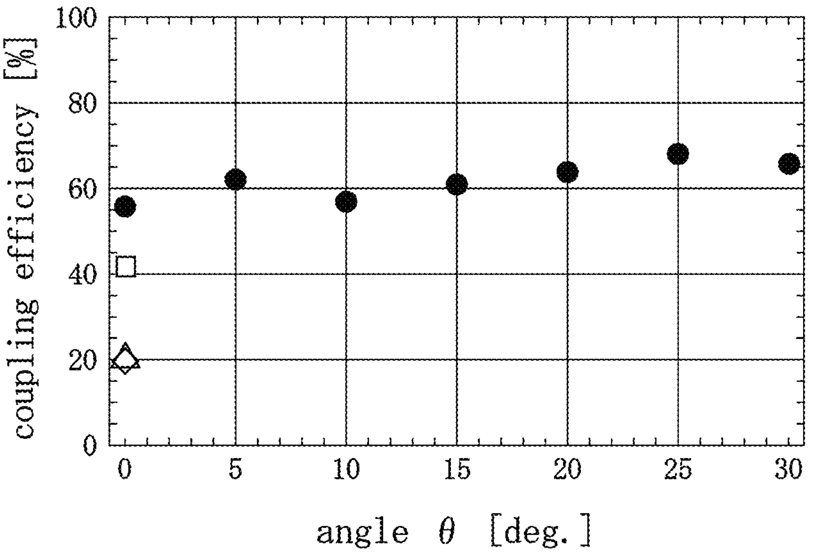
FIG. 5 is a diagram showing the relationship between the inclination of the optical axis of the convex lens surface of a compound eye lens and the coupling efficiency.
Figure 11:
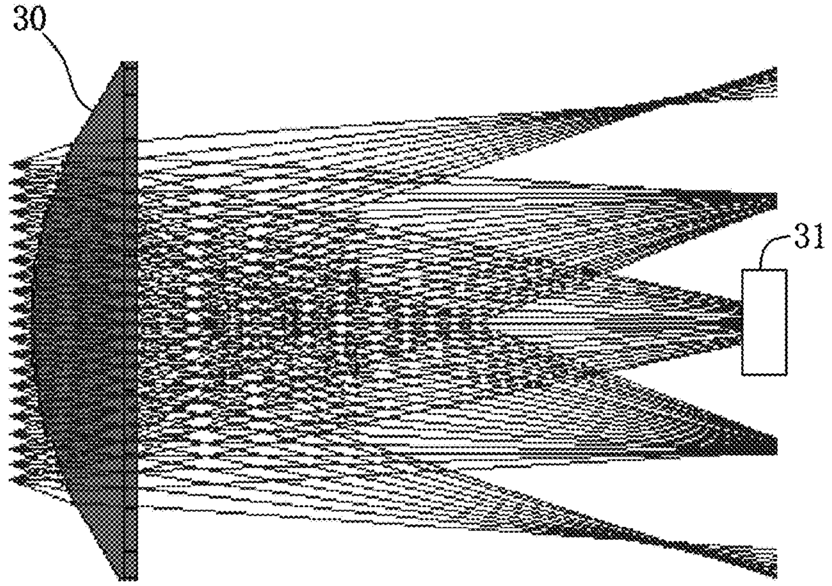
FIG. 11 is an example of ray tracing simulation results when diffused light is incident on a light receiving device equipped with a plano-convex lens as a condensing lens.
Figure 12:
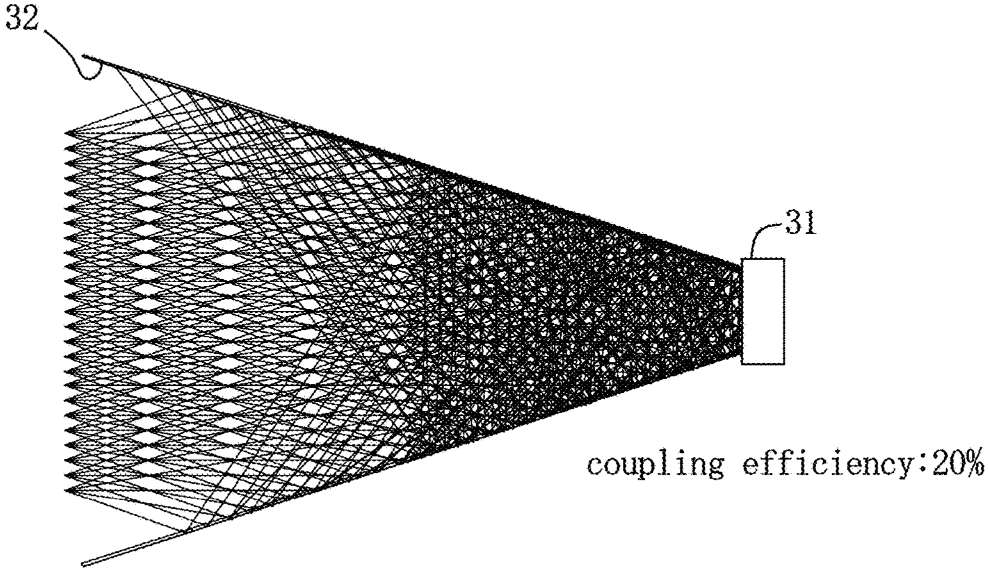
FIG. 12 is an example of a ray tracing simulation result when diffused light is incident on a light receiving device equipped with a reflecting mirror that reflects the light on the inner surface of a conical cylinder.
Figure 13:
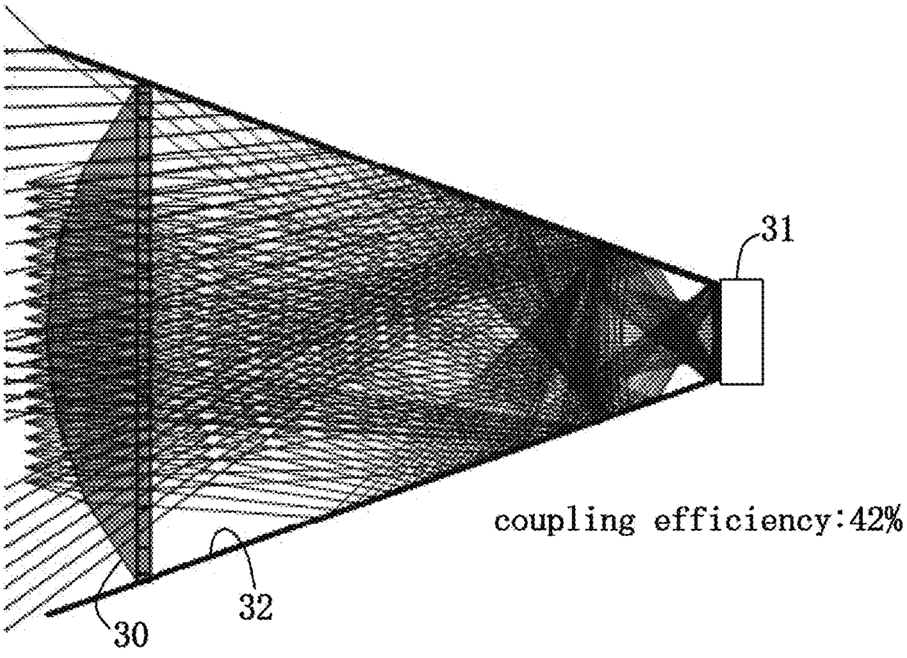
FIG. 13 is an example of a ray tracing simulation result when the condensing lens in FIG. 11 and the reflecting mirror in FIG. 12 are combined.

FIG. 5 shows the coupling efficiency when the intersection angle θ between the center line C and the optical axes of the plurality of microlenses is increased in 5° increments from 0° to 30°, together with the above comparative example. In the comparative examples, the case in FIG. 13 is indicated by a square (□), the case in FIG. 12 is indicated by a triangle (Δ), and the case in FIG. 11 is indicated by a diamond (◇).

In FIG. 5, as the intersection angle θ increases, the coupling efficiency becomes larger than when the intersection angle $\theta=0°$. Therefore, when the condensing lens 2 is a compound lens in which the optical axes of the plurality of convex lens surfaces 14 are each inclined to intersect the center line C of the reflective surface 7 at an intersection angle θ of 30° or less, further improvement of the coupling efficiency can be achieved. Even if the inclinations of the optical axes of the plurality of convex lens surfaces 14 are not the same, if the intersection angle θ with the center line C is 30° or less, the coupling efficiency can be improved more than when the intersection angle θ is 0°. This will be easily understood.

Next, the formation of a compound eye lens in which the optical axes of the plurality of convex lens surfaces 14 are each tilted so as to intersect the center line C of the reflective surface 7 will be described. Since it is not easy to form a plurality of convex lens surfaces 14 with tilted optical axes on a flat surface, the plurality of convex lens surfaces 14 are formed on a surface formed in a convex shape.

Figure 6:
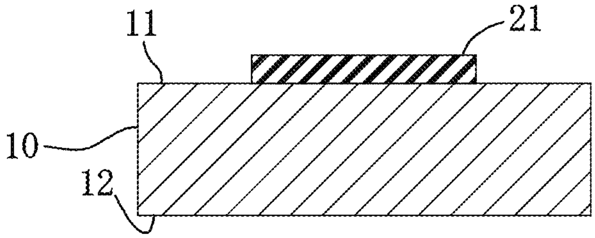
FIG. 6 is an explanatory diagram of a first resist film forming step for forming a convex surface.
Figure 7:
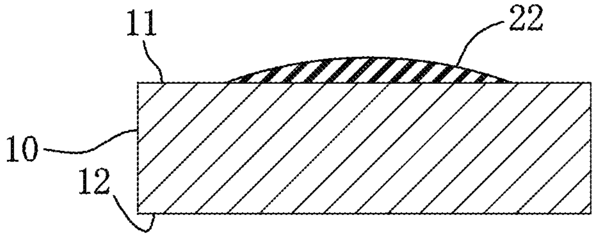
FIG. 7 is an explanatory diagram of a first resist mask forming step for forming a convex surface.

As shown in FIG. 6, a first resist film 21 is formed in the center of the first surface 11 of the semiconductor substrate 10 in a circular shape in plan view, with the center of this circle coinciding with the center of the semiconductor substrate 10 (first resist film 21 forming process). Next, by heating this semiconductor substrate 10 to, for example, about 150° C. to melt the first resist film 21, a plano-convex lens shape is formed using the surface tension of the melted first resist film 21, as shown in FIG. 7. Thereby, a first resist mask 22 is formed (first resist mask forming step).

Figure 8:
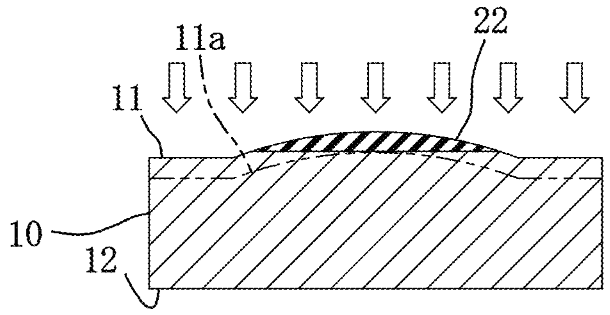
FIG. 8 is an explanatory diagram of a convex surface etching process.

Next, as shown in FIG. 8, the first surface 11 side of the semiconductor substrate 10 is etched by reactive ion etching (RIE) until the first resist mask 22 is removed (convex etching step). In this way, a convex surface 11*a* reflecting the shape of the first resist mask 22 is formed on the first surface 11 of the semiconductor substrate 10. Note that the flat surface around the convex surface 11*a* becomes the first surface 11 of the semiconductor substrate 10 exposed by etching.

Figure 9:
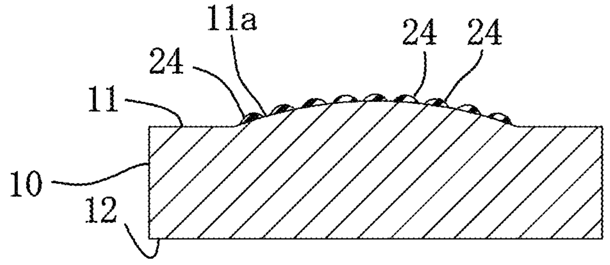
FIG. 9 is an explanatory diagram of a second resist mask forming process for forming a plurality of convex lens surfaces.

Next, as shown in FIG. 9, a plurality of convex lens shaped second resist masks 24 are formed using the same method as for forming the first resist mask 22 (second resist mask forming step). Specifically, a plurality of second resist films for forming a plurality of convex lens surfaces 14 are formed on the convex surface 11*a* and heated, and the surface tension of the second resist film is used to form a plurality of convex lens shaped second resist mask 24.

Figure 10:
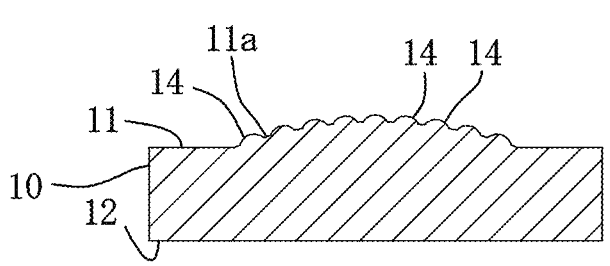
FIG. 10 is an explanatory diagram of a compound eye lens formed on a convex surface.

Next, although not shown, same as in FIG. 8, the first surface 11 side of the semiconductor substrate 10 is etched by reactive ion etching (RIE) until the plurality of second resist masks 24 are removed. In this way, as shown in FIG. 10, a plurality of convex lens surfaces 14 reflecting the shapes of the plurality of second resist masks 24 are formed on the convex surface 11*a*. Note that the area around the plurality of convex lens surfaces 14 becomes a convex surface 11*a* exposed by etching, and the flat surface around this convex surface 11*a* becomes the first surface 11 of the semiconductor substrate 10 exposed by etching.

As described above, a plurality of partially spherical convex lens surfaces 14 having a smaller radius of curvature than the convex surface 11*a* are integrally formed on the partially spherical convex surface 11*a* formed on one surface (first surface 11) of the semiconductor substrate 10. Thereby, the condensing lens 2, which is a compound eye lens, is formed. The center of the circular contour of the convex surface 11*a* is aligned with the center of the condensing lens 2. Although the description has been made using the semiconductor substrate 10 in the form of individual pieces, it is also possible to form a plurality of compound lenses at once on the semiconductor substrate 10 in the form of a wafer, and then divide the semiconductor substrate 10 into individual pieces.

Since a plurality of convex lens surfaces 14 are formed along the convex surface 11*a* of the condensing lens 2, the further the distance from the center of the condensing lens 2, the more the intersection angle θ between the optical axis passing through the center line C of the reflective surface 7 and the center of the convex lens surface 14. For example, by adjusting the viscosity of the first resist film 21, the radius of curvature of the convex surface 11*a* can be adjusted, and the intersection angle θ of the optical axes of the plurality of convex lens surfaces 14 can be adjusted. On the other hand, by omitting the formation of the convex surface 11*a* and integrally forming the plurality of convex lens surfaces 14 on the flat first surface 11 in the same manner as above, the optical axes of the plurality of convex lens surfaces 14 are aligned with the center line C. Thereby, it is possible to form compound eye lenses (see FIG. 3) having a plurality of the convex lens surfaces whose optical axes are parallel with the center line C.

The functions and effects of the light receiving device 1 will be explained. In the light receiving device 1, a part of the light transmitted through the condensing lens 2, which is a compound eye lens, is reflected by the reflective surface 7 in the lens holder 3 and travels through the truncated cone shaped optical path section 6, and is received by the semiconductor light receiving element 4. Since the condensing lens 2 is a compound eye lens, the plurality of convex lens surfaces 14 can condense diffused light that enters the entire condensing lens 2 from various directions. The reflecting surface 7 can reflect and condense a portion of the light that has passed through the condensing lens 2, and make it incident on the semiconductor light receiving element 4, which has a smaller diameter than the condensing lens 2. Therefore, the coupling efficiency when diffused light is incident can be improved.

The condensing lens 2 is a compound eye lens having a plurality of convex lens surfaces 14 arranged along a partially spherical convex surface 11*a*. The optical axes of the plurality of convex lens surfaces 14 arranged on the convex surface 11*a* are tilted toward the semiconductor light receiving element 4, so that the light transmitted through the condensing lens 2 can easily be made incident to the semiconductor light receiving element 4.

The condensing lens 2 is a compound lens having a plurality of convex lens surfaces 14, and the further away from the center line C of the reflective surface 7 passing through the center of the condensing lens 2, the more the optical axis of the convex lens surface 14 is tilted relative to the center line C. As a result, the optical axes of the plurality of convex lens surfaces 14 are tilted toward the semiconductor light receiving element 4, so that the light transmitted through the condensing lens 2 can be made easier to enter the semiconductor light-receiving element 4.

The condensing lens 2 having a plurality of convex lens surfaces 14 can be formed by processing a silicon substrate with high precision as the semiconductor substrate 10, and the light receiving device 1 is suitable for spectroscopic analysis using infrared light transmitted through the silicon substrate.

The condensing lens 2 may be, for example, a compound eye lens made of an optical resin material, and the light receiving device 1 may be formed with a semiconductor light receiving element 4 that corresponds to the light that passes through the compound eye lens. In addition, the number and size of the plurality of convex lens surfaces 14, the size of the convex surface 11*a*, the size and inclination angle φ of the reflective surface 7, the size of the semiconductor light receiving element 4, etc. are set as appropriate based on the performance required to the light receiving device 1. In addition, those skilled in the art can implement various modifications to the embodiments described above without departing from the spirit of the present invention, and the present invention includes such modifications.

The invention claimed is:

1. A light receiving device comprising a condensing lens, a lens holder on which the condensing lens is attached, a semiconductor light receiving element, and a base for fixing the semiconductor light receiving element and the lens holder, in which light transmitted through the condensing lens enters the semiconductor light receiving element through a single optical path section in the lens holder; wherein the condensing lens is a compound eye lens having a plurality of convex lens surfaces on one side, the lens holder has a cylindrical reflective surface facing the optical path section formed in a truncated cone shape whose diameter decreases as it approaches the semiconductor light receiving element from the condensing lens, and a part of the light transmitted through the condensing lens is reflected by the reflective surface and enters the semiconductor light receiving element.

2. The light receiving device according to claim 1, wherein the condensing lens is a compound eye lens comprising the convex lens surface formed on a partially spherical convex surface that is formed on one side of the condensing lens so as to have a radius of curvature smaller than that of the convex surface.

3. The light receiving device according to claim 1, wherein the condensing lens is a compound eye lens such that the farther it is from the center line of the reflective surface passing through the center of the condensing lens, the larger an intersection angle between the center line and the optical axis passing through the center of the convex lens surface.

4. The light receiving device according to claim 1, wherein the condensing lens is a compound eye lens in which a plurality of convex lens surfaces are integrally formed on a silicon substrate, and the semiconductor light receiving element receives infrared light.

* * * * *